United States Patent [19]

Shizuhara

[11] 3,984,782
[45] Oct. 5, 1976

[54] BIAS CONTROL CIRCUIT FOR AN AUDIO AMPLIFIER UTILIZING AN UNSATURATED JUNCTION TYPE FET

[75] Inventor: Shuji Shizuhara, Akikawa, Japan

[73] Assignee: Sansui Electric Co., Ltd., Tokyo, Japan

[22] Filed: Dec. 22, 1975

[21] Appl. No.: 643,410

[30] Foreign Application Priority Data

Dec. 21, 1974 Japan.................... 49-155382[U]

[52] U.S. Cl. .................................. 330/35; 330/13; 330/15; 330/22; 330/40
[51] Int. Cl.[2] ........................................ H03F 3/16
[58] Field of Search ............... 330/13, 15, 17, 22, 330/35, 40

[56] References Cited
UNITED STATES PATENTS
3,921,089  11/1975  Tsurushima...................... 330/35 X Primary Examiner—R. V. Rolinec
Assistant Examiner—Lawrence J. Dahl
Attorney, Agent, or Firm—Harris, Kern, Wallen & Tinsley

[57] ABSTRACT

A power amplifier stage for an audio amplifier is constituted by a complementary pair of one N channel and one P channel unsaturated function FETs forming a single ended pushpull circuit. The stage is energized by a first d.c. power source. The gate potentials of the FETs are controlled by a series of control type constant voltage source comprising a pair of complementary series connected control transistors energized by a second d.c. power source which varies at the same rate as the first d.c. power source. A comparison circuit including a second pair of complementary transistors is connected to a d.c. reference voltage which varies to a smaller level than the first and second d.c. power sources in order to provide a constant quiescent current flowing in the drain circuits of the FETs even if the first and second d.c. voltage levels fluctuate.

7 Claims, 3 Drawing Figures

BIAS CONTROL CIRCUIT FOR AN AUDIO AMPLIFIER UTILIZING AN UNSATURATED JUNCTION TYPE FET

BACKGROUND OF THE INVENTION

The present invention relates to a bias control circuit for an audio amplifier utilizing as an amplifier element a field effect transistor (hereinafter referred to as "FET"), more particularly, a vertical or unsaturated junction type FET.

In the field of an audio amplifier, there has recently been accepted the type which uses an unsaturated junction type FET as an active circuit element constituting its final or power amplifier stage. Namely, an unsaturated junction type FET is an active circuit element showing the so-called triode tube characteristic different from the prior art saturated type FET which indicates the so-called pentode tube characteristic. Therefore said unsaturated junction type FET has an excellent advantage in amplifying audio signals of a particularly large input level.

On the other hand, an unsaturated junction type FET has the disadvantage that the amount of its drain current $I_D$ varies with the drift of its drain-to-source voltage $V_{DS}$. Consequently, an audio amplifier containing an unsaturated junction type FET involves the problem that the amount of its drain current $I_D$ varies with its power supply voltage, even if its gate-to-source voltage $V_{GS}$ is kept at a constant value, resulting in the crossover distortion of a signal amplified by the FET as well as the undue increment of its temperature.

Accordingly, practical application of an audio amplifier containing an unsaturated junction type FET is primarily governed by the extent to which the drift of its drain current $I_D$ can be reduced with respect to the fluctuation of its power supply voltage.

Thus a counter measure hitherto adopted for an audio amplifier containing an unsaturated junction type FET to prevent the drift of its drain current $I_D$ with respect to the fluctuation of its power supply voltage is exemplified by one in which power sources for the driver stage (usually constituted by a bipolar transistor) and the final power amplifier stage formed of the FET are respectively constituted by constant voltage sources. From the technical as well as the economical viewpoint, it raises little problem that a power source for the driver stage consuming a relatively small amount of power is constituted by a constant voltage source. Where, however, a power source for the power amplifier stage consuming a maximum amount of power is constituted by a constant voltage source, then some technical difficulties arise in addition to the required use of expensive circuit elements of a large current capacity as the constituent elements of the constant voltage source.

For this reason, an audio amplifier utilizing an unsaturated junction type FET is desired to have such a circuit arrangement that the amount of drain current $I_D$ flowing into the FET can always be kept substantially constant, without employing a constant voltage source for the power amplifier stage including the FET, even if the level of its power supply voltage is fluctuated by any cause.

Such a circuit arrangement may include the type which enables the level of the gate-to-source potential $V_{GS}$ of the FET to drift at substantially the same rate as its drain-to-source voltage $V_{DS}$, even if the level of the power supply voltage is fluctuated. To provide a practical circuit arrangement for the above-mentioned object, those skilled in the art can readily think of a process of employing the power sources whose voltages always fluctuate at a substantially equal level for the driver and power amplifier stages, without utilizing constant voltage sources.

However, such a circuit arrangement can not yet maintain the drain current $I_D$ flowing into the FET at a constant value even if the levels of the power supply voltages are fluctuated. The reason is that voltage $V_{GS}$ applied between the gate and source of the FET varies at a higher level than that of voltage $V_{DS}$ impressed between the drain and source thereof due to the voltage amplification factor $\mu$ of the FET.

SUMMARY OF THE INVENTION

It is, therefore, the object of the present invention to provide a bias control circuit for an audio amplifier utilizing an unsaturated junction type FET capable of so controlling its gate-to-source potential or gate bias voltage as to enable the amount of drain current flowing thereinto always to maintain substantially constant, even if the level of its power supply voltage is fluctuated.

According to the preferred embodiment of the invention, there is provided a bias control circuit for an audio amplifier utilizing an unsaturated junction type FET, the improvement wherein said amplifier includes at least a power amplifier circuit comprising a complementary pair of one N channel and one P channel-FET's forming a single ended push-pull circuit, the N channel FET having a drain connected to the positive terminal of a first dc power source of a predetermined voltage and a source connected via a load to a ground potential, and the P channel FET having a drain connected to the negative terminal of the first dc power source and a source connected via the load to the ground potential; and wherein said bias control circuit comprises a series control type constant voltage source constructed of a first complementary pair of one PNP type and one NPN type control transistors, the PNP type control transistor having a collector-emitter path connected between the negative terminal of a second dc power source with its voltage predetermined and varied at substantially the same rate as that of the first dc power source and the gate of the N channel FET included in said power amplifier circuit and coupled via the gate bias circuit thereof to one terminal of an input audio signal source with the other terminal connected to the ground potential, and the NPN type control transistor having a collector-emitter path connected between the positive terminal of the second dc power source and the gate of the P channel FET included in said power amplifier circuit and coupled via the gate bias circuit thereof to the nongrounded side terminal of the input audio signal source; of a second complementary pair of one PNP type and one NPN type comparison transistors, the PNP type comparison transistor having a base coupled to the base bias circuit thereof forming a first comparator and a collector connected via a first detection resistor to the negative terminal of the second dc power source coupled with the collector of the PNP type control transistor and connected also to the base thereof, and the NPN type comparison transistor having a base coupled to the base bias circuit thereof forming a second comparator and a collector connected via a second detection resistor of substantially the same resistance value as the first detection resistor to the positive terminal of the second dc power source coupled with the collector of the NPN type control transistor and connected also to the base thereof; and of a reference voltage source disposed to induce a reference dc voltage varied at a smaller voltage level than those of the first and second dc power sources in a current conduction path between the positive terminal of the second dc power source and the ground potential and including a series circuit of a voltage regulator element and a third resistor with its nongrounded side terminal connected to the emitter of the NPN type comparison transistor.

The bias control circuit constructed as mentioned above has the advantage capable of maintaining the amounts of drain current flowing into the complementary pair of FET's substantially constant, even if the levels of their drain-to-source voltages and those of their gate-to-source voltages drift with the first and second dc power sources.

PREFERRED EMBODIMENT OF THE INVENTION

A bias control circuit utilizing an unsaturated junction type FET according to the preferred embodiment of the invention will now be described by reference to the appended drawings.

Figure 1:
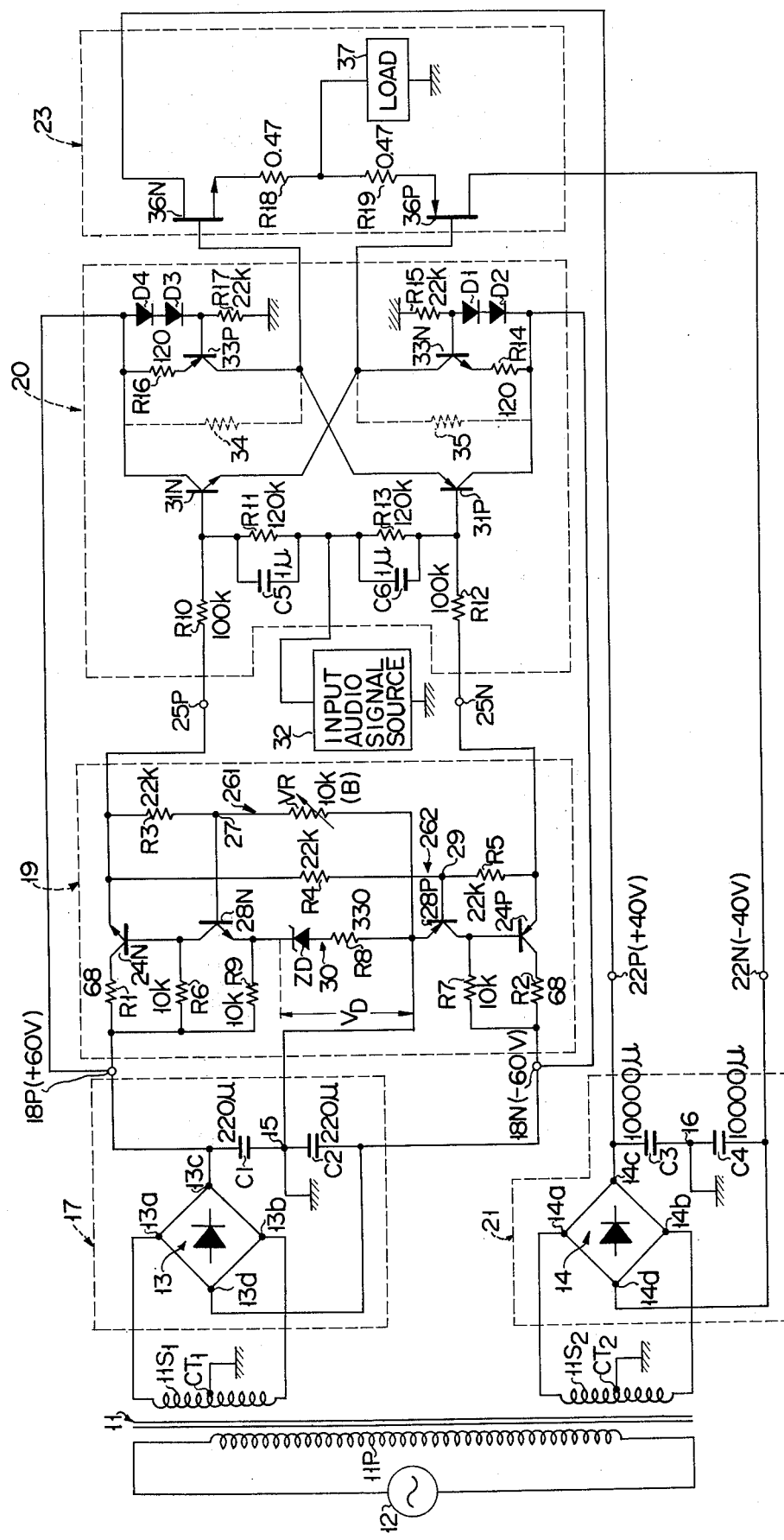
FIG. 1 is a schematic circuit diagram of a bias control circuit utilizing an unsaturated junction type FET in accordance with the invention.

FIG. 1 is a schematic circuit diagram according to one embodiment of the invention. In FIG. 1, reference numeral 11 denotes a power transformer comprising a primary winding 11P having two ends connected across an ac power source 12, and two secondary windings $11S_1$ and $11S_2$ electromagnetically coupled to the primary winding 11P and having their center taps $CT_1$ and $CT_2$ connected to a reference or ground potential, respectively. One, e.g., $11S_1$ of the secondary windings has two ends connected to the corresponding input terminals 13a and 13b of a full wave rectifier bridge 13. Thus, the rectifier bridge 13 is so constructed as to induce positive and negative dc voltages having a predetermined value, e.g., ± 60 volts on its positive and negative output terminals 13c and 13d.

Similarly, the other secondary winding $11S_2$ has two ends connected to the corresponding input terminals 14a and 14b of a full wave rectifier bridge 14 with its positive and negative output terminals 14c and 14d designed to induce thereon positive and negative dc voltages of a predetermined value, e.g., ± 40 volts. Two smoothing capacitors C1 and C2 are connected in series between the rectifier bridge output terminals 13c and 13d. The junction 15 of the capacitors C1 and C2 is connected to the ground potential. Similarly, two smoothing capacitors C3 and C4 are connected in series between the rectifier bridge output terminals 14c and 14d, the junction 16 of the capacitors C3 and C4 being connected to the ground potential.

Thus, a circuit portion 17 including the rectifier bridge 13 and the smoothing capacitors C1 anc C2 acts as to impress the aforesaid ± dc 60 volts on positive and negative dc power source terminals 18P and 18N connected respectively to the positive and negative output terminals 13c and 13d of the rectifier bridge 13, the positive and negative dc power source terminals 18P and 18N jointly constituting a dc power source for the later described series control type constant voltage source 19 used as a subject bias control circuit according to the invention and driver circuit 20 respectively formed of two bipolar transistors.

On the other hand, a circuit portion 21 including the rectifier bridge 14 and the smoothing capacitors C3 and C4 functions as to apply the aforesaid ± dc 40 volts to positive and negative dc power source terminals 22P and 22N connected respectively to the positive and negative output terminals 14c and 14d of the rectifier bridge 14, and jointly constituting a dc power source for the later described power amplifier circuit 23 formed of two unsaturated junction type FET's.

The series control type constant voltage source 19 includes a complementary pair of one NPN type and one PNP type series control bipolar transistors 24N and 24P forming first and second control sections for the balanced type constant voltage source 19. The NPN type control transistor 24N forming the first control section has a collector connected to the positive dc power source terminal 18P via a resistor R1 provided if necessary and having an appropriate resistance value, e.g., 68 Ω, and an emitter connected to the positive side output terminal 25P of the constant voltage source 19. The PNP type control transistor 24P has a collector connected to the negative dc power source terminal 18N via a resistor R2 of the same resistance value as the resistor R1, and an emitter connected to the negative side output terminal 25N of the constant voltage source 19. Connected in series between the emitter of the NPN type control transistor 24N and the ground potential are a resistor R3 of a preselected resistance value, e.g., 22 kΩ and a variable resistor VR of an appropriate resistance value, e.g., 10 kΩ, the series circuit of the resistor R3 and the variable resistor VR jointly constituting a first comparison section 261 for the constant voltage source. Similarly, connected in series between the emitter of the NPN type control transistor 24N and that of the PNP type control transistor 24P are a resistor R4 and a resistor R5 having prescribed resistance values, e.g., 22 kΩ respectively and jointly forming a second comparison section 262 for the constant voltage source 19.

The junction 27 of the resistor R3 and the variable resistor VR forming the first comparison section 261 is connected to the base of an NPN type comparison bipolar transistor 28N. The comparison transistor 28N has a collector connected to the base of the NPN type control transistor 24N and also to the positive dc power source terminal via a detection resistor R6 having a predetermined resistance value, e.g., 10 kΩ and forming a first detection section for the constant voltage source 19. Similarly, the junction 29 of the resistors R4 and R5 forming the second comparison section 262 is connected to the base of a PNP type comparison bipolar transistor 28P. The comparison transistor 28P has a collector connected to the base of the PNP type control transistor 24P and also to the negative dc power source terminal 18N via a detection resistor R7 having the same resistance value as the detection resistor R6 and forming a second detection section for the constant voltage source 19.

Thus, a series circuit of a zener diode ZD and a resistor R8 of a preselected resistance value, e.g., 330 Ω which jointly constitute a reference voltage source 30 for the constant voltage source 19 is connected between the emitter of the NPN type comparison transistor 28N and the grounded emitter of the PNP type comparison transistor 28P. The nongrounded side terminal of the reference voltage source 30, i.e., the cathode of the zener diode ZD connected to the emitter of the NPN type comparison transistor 28N is connected to the positive dc power source terminal 18P.

Thus, the positive and negative output terminals 25P and 25N of the constant voltage source 19 are used, as hereinunder described, as the base bias sources of a complementary pair of one NPN type and one PNP type emitter follower bipolar transistors 31N and 31P jointly constituting the driver circuit 20 which is formed of the so called single ended pushpull (hereinunder referred to as "SEPP") circuit and which controls the gate potentials or gate-to-source potentials $V_{GS}$ of two FET's 36N and 36P jointly constituting the power amplifier circuit 23.

The positive side output terminal 25P of the constant voltage source 19 is connected via two series-connected resistors R10 and R11 having respectively prescribed resistance values, e.g., 100 kΩ and 120 kΩ to one nongrounded side terminal of a conventional input audio signal source 32 with the other terminal connected to the ground potential.

Similarly, the negative side output terminal 25N of the constant voltage source 19 is connected via two series-connected resistors R12 and R13 having respectively the same resistance values of the resistors R10 and R11 to the nongrounded side terminal of the input audio signal source 32. Coupling capacitors C5 and C6 having the same appropriate capacitance value, e.g., 1 μF are respectively connected in parallel with the resistors R11 and R13. The junction of the resistors R10 and R11 is connected to the base of the NPN type emitter follower driver transistor 31N with its collector connected to the positive dc power source terminal 18P. Similarly, the juncture of the resistors R12 and R13 is connected to the base of the PNP type emitter follower driver transistor 31P with its collector connected to the negative dc power source terminal 18N. The emitter of the driver transistor 31N is connected to the collecter of an NPN type bipolar transistor 33N constituting an emitter load resistance network for the transistor 31N formed of a kind of constant current source. The transistor 33N has an emitter connected via a resistor R14 of a predetermined resistance value, e.g., 120 Ω to the negative dc power source terminal 18N, and a base connected thereto via two forward biased and series-connected diodes D1 and D2 and also to the ground potential via a resistor R15 of a preselected resistance value, e.g., 22 kΩ.

Similarly, the emitter of the PNP type driver transistor 31P is connected to the collector of a PNP type bipolar transistor 33P constituting an emitter load resistance network for the transistor 31P formed of a constant current source, the transistor 33P having an emitter connected via a resistor R16 of the same resistance value as the resistor R14 to the postive dc power source terminal 18P, and a base connected thereto via two forward biased and series-connected diodes D3 and D4 and also to the ground potential via a resistor R17 of the same resistance value as the resistor R15. The aforesaid emitter load resistance networks for the driver transistors 31N and 31P are respectively replaced by single resistors having the same appropriate resistance value and shown by phantoms 34 and 35 in FIG. 1.

One the other hand, the power amplifier circuit 23 is comprised of a complementary pair of one N channel and one P channel source follower FET's 36N and 36P jointly forming a SEPP circuit. The P channel FET 36P has a gate connected to the emitter of the NPN type driven transistor 31N, a drain connected to the negative dc source terminal 22N, and a source connected via a source load resistor R19 of an appropriate resistance value, e.g., 0.47 Ω to one nongrounded side terminal of a load 37 such as a loudspeaker with the other terminal connected to the ground potential. Similarly, the N channel FET 36N has a gate connected to the emitter of the PNP type driver transistor 31P, a drain connected to the positive dc source terminal 22P, and a source connected via a source load resistor R18 of the same resistance value as the resistor R19 to the nongrounded side terminal of the load 37.

The operation of the circuitry of FIG. 1 will now be described. Assuming that the voltage level of the ac power source 12 is fluctuated by any cause, then those of the positive and negative dc voltages induced on the positive and negative dc source terminals 22P and 22N inevitably vary as apparent to those skilled in the art. As a result, the amounts of drain current flowing through the drain-source paths of the FET's 36N and 36P forming the power amplifier circuit 23 tend to drift. At the same time, the positive and negative dc voltage levels induced on the positive and negative dc power source terminals 18P and 18N vary at substantially the same rate as those induced on the aforesaid dc source terminals 22P and 22N.

For this reason, if the bias control circuit 19 formed of the series control balance type constant voltage source is not provided, then the amounts of emitter current of the transistors 31N and 31P constituting the driver circuit 20 and in consequence their emitter potentials for defining the source-to-gate potentials $V_{GS}$ of the FET's 36P and 36N forming the power amplifier circuit 23 drift at substantially the same rate as their drain-to-source voltages $V_{DS}$ with the polarities, thereby compensating changes in their drain current $I_D$. If, however, the gate-to-source voltages $V_{GS}$ of the FET's 36P and 36N fluctuate, as mentioned above, in almost the same amount as their drain-to-source voltages $V_{DS}$, then the aforesaid drift compensation for the drain current $I_D$ of the FET's 36P and 36N depending on their gate-to-source voltages $V_{GS}$ will be carried to the excess due to the voltage amplification factor $\mu$ of the FET's preventing their drain current $I_D$ from being kept constant.

According to the present invention, the bias control circuit 19 is provided, offering the advantage that the drift of the drain current flowing into the FET's 36P and 36N can always be reduced to the smallest possible extent as described hereinunder, even if the voltage levels of the ac power source 12 is drifted. That is, where the dc voltage levels induced on the positive and negative dc power source terminals 18P and 18N fluctuate with that of the ac power source 12, then the value of voltage $V_D$ impressed across the reference voltage source 30 included in the constant voltage source 19 is equal to a sum of the voltage applied across the zener diode AD with a constant level and the voltage induced across the resistor R8 with a level varied at substantially the same rate as those of the dc voltages induced on the positive and negative dc power source terminals 18P and 18N. In consequence, the level of said voltage $V_D$ always drifts at a smaller rate than those of the dc voltages induced on the positive and negative dc power source terminals 18P and 18N.

As a result, those dc voltages impressed on the positive and negative output terminals 25P and 25N of the constant voltage source 19 through the comparison transistors 28N–28P, the detection resistors R6–R7 and the control transistors 24N–24P which define the base bias voltages of the driver transistors 31N–31P, i.e., the gate-to-source potentials $V_{GS}$ of the FET's 36P and 36N included in the power amplifier circuit 23 drift, as apparent to those skilled in the art, at a smaller rate than their drain current $I_D$. For this reason, the present inventor has experimentally proved that the selection of the zener diode ZD used and the resistance value of the resistor R8 included in the reference voltage source 30 enables the drain current flowing into the FET's 36P and 36N forming the power amplifier circuit 23 to be always kept substantially constant, even if the voltage level of the ac power source 12 is drifted for any reason.

Accordingly, the audio amplifier constructed as shown in FIG. 1 enables any audio frequency signal supplied from the input audio signal source to the driver circuit 20 to be appropriately amplified and delivered with the most possible excellent quality from the power amplifier circuit 23.

It should be noted that, if the reference voltage source 30 included in the constant voltage source 19 is only constituted by the zener diode ZD as in the prior art, then the drain current $I_D$ flowing into the FET's 36P and 36N changes with the voltage level of the ac power source 12.

Figure 2:
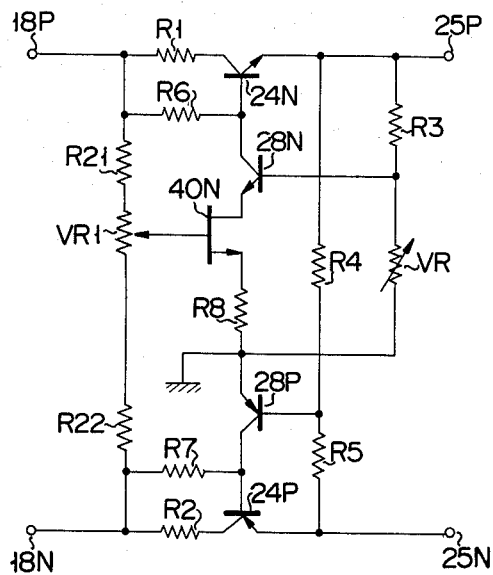
FIG. 2 is a schematic circuit diagram of one modification of a constant voltage source portion shown in FIG. 1.

FIG. 2 is a schematic circuit diagram of one modification of the constant voltage source 19 shown in FIG. 1.

The modification of FIG. 2 has the same construction as the constant voltage source 19 of FIG. 1, excepting that the zener diode ZD of FIG. 1 is replaced by an N channel saturated junction type FET 40N having the hereinunder described circuit connection. The FET 40N has a drain connected to the emitter of the NPN type comparison transistor 28N, a source connected via the resistor R8 to the ground potential, and a gate connected to the slidable arm of a variable resistor VR₁, one end of which is connected via a resistor R21 to the positive dc power source terminal 18P and the other end of which is connected via a resistor R22 to the negative dc power source terminal 18N. The parts of FIG. 2 corresponding to those of FIG. 1 are denoted by the same symbols and the description thereof is omitted.

It will be apparent that the replacement of the constant voltage source constructed as shown in FIG. 2 for that of FIG. 1 operates in a similar manner to, and can attain substantially the same effect as, the embodiment of FIG. 1.

It will be also apparent that the adjustment of the variable resistor VR shown in FIG. 1 or 2 varies the level of output voltages induced on the positive and negative output terminals 25P and 25N of the constant voltage source 19.

Figure 3:
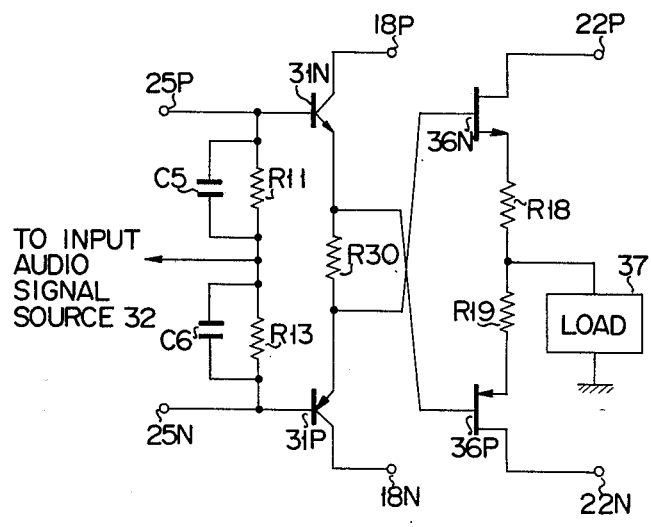
FIG. 3 is a schematic circuit diagram of one modification of a driver circuit portion shown in FIG. 1.

FIG. 3 is a schematic circuit diagram of one modification of the driver circuit 20 shown in FIG. 1.

THe modification of FIG. 3 has the same construction as the driver circuit 20 of FIG. 1, excepting that the emitter load resistance networks of the NPN and PNP type driver transistors 31N and 31P are replaced by a single resistor R30 interconnecting their emitters. The parts of FIG. 3 corresponding to those of FIG. 1 are designated by the same symbols and the description thereof is omitted. It will be apparent that the replacement of the driver circuit constructed as shown in FIG. 3 for that of FIG. 1 operates in a similar manner to, and can obtain almost the same effect as the embodiment of FIG. 1.

While the invention has been described in terms of the preferred embodiment, it should be understood that various changes and modifications will occur to those skilled in the art, without departing from the scope of the invention as defined in the appended claims.

What is claimed is:

1. A bias control circuit for an audio amplifier utilizing an unsaturated junction type FET, the improvement wherein said amplifier includes at least a power amplifier circuit comprising a complementary pair of one N channel and one P channel FETs forming a single ended pushpull circuit, the N channel FET having a drain connected to the positive terminal of a first dc power source of a predetermined voltage and a source connected via a load to a ground potential, and the P channel FET having a drain connected to the negative terminal of the first dc power source and a source connected via the load to the ground potential; and wherein said bias control circuit comprises a series control type constant voltage source constructed of a first complementary pair of one PNP type and one NPN type control transistors, the PNP type control transitor having a collector-emitter path connected between the negative terminal of a second dc power source with its voltage predetermined and varied at subtantially the same rate as that of the first dc power source and the gate of the N channel FET included in said power amplifier circuit and coupled via the gate bias circuit thereof to one terminal of an input audio signal source with the other terminal connected to the ground potential, and the NPN type control transistor having a collector-emitter path connected between the postive terminal of the second dc power source and the gate of the P channel FET included in said power amplifier circuit and coupled via the gate bias circuit thereof to the nongrounded side terminal of the input audio signal source; of a second complementary pair of one PNP type and one NPN type comparison transistors, the PNP type comparison transistor having a base coupled to the base bias circuit thereof forming a first comparator and a collector via a first detection resistor to the negative terminal of the second dc power source coupled with the collector of the PNP type control transistor and connected also to the base thereof, and the NPN comparison transistor having a base coupled to the base bias circuit thereof forming a second comparator and a collector connected via a second detection resistor of substantially the same resistance value as the first detection resistor to the postive terminal of the second dc power source coupled with the collector of the NPN type control transistor and connected also to the base thereof; and of a reference voltage source disposed to induce a reference dc voltage varied at a smaller voltage level than those of the first and second dc power sources in a current conduction path between the positive terminal of the second dc power source and the ground potential and including a series circuit of a voltage regulator element and a third resistor with its nongrounded side terminal connected to the emitter of the NPN type comparison transistor.

2. The bias control circuit claimed in claim 1, wherein the voltage regulator element included in said reference voltage source comprises a zener diode having an anode connected to one nongrounded side terminal of the third resistor with the other terminal connected to the ground potential and a cathode connected to the emitter of the NPN type comparison transistor and also to the positive terminal of the second dc power source via a resistor.

3. The bias control circuit claimed in claim 1, wherein the voltage regulator element included in said reference voltage source comprises a saturated junction type FET having a gate connected to the slidable arm of a variable resistor one end of which is connected via a fourth resistor to the positive terminal of the second dc power source and the other end of which is connected via a fifth resistor to the negative terminal of the second dc power source, a drain connected to the emitter of the NPN type comparison transistor, and a source connected to one nongrounded side terminal of the third resistor with the other terminal connected to the ground potential.

4. The bias control circuit claimed in claim 1, wherein the gate bias circuits of the complementary pair of FET's jointly constituting said power amplifier circuit comprise a driver circuit including a third complementary pair of one NPN type and one PNP type driver transistors jointly forming a single ended push-pull circuit, the third NPN type driver transistor having a collector connected to the positive terminal of the second dc power source, a base connected via a fourth resistor to that emitter of the first NPN type control transistor which forms one output terminal of said constant voltage source and also connected via a fifth resistor to one nongrounded side terminal of the input audio signal source with the other terminal connected to the ground potential, and an emitter connected via an emitter load resistance network to the negative terminal of the second dc power source, and the third PNP type driver transistor having a collector connected to the negative terminal of the second dc power source, a base connected via a sixth resistor of substantially the same resistance value as the fourth resistor to that emitter of the first PNP type control transistor which forms the other output terminal of said constant voltage source and also connected via a seventh resistor of substantially the same resistance value of the fifth resistor to the nongrounded side terminal of the input audio signal source, and an emitter connected via another emitter load resistance network to the positive terminal of the second dc power source.

5. The bias control circuit claimed in claim 4, wherein the emitter load resistance networks of the third complementary pair of driver transistors comprise a constant current source including a fourth complementary pair of one NPN type-and one PNP type-bipolar transistors, the fourth NPN type bipolar transistor having an emitter connected via an eighth resistor to the negative terminal of the second dc power source, a base coupled to a constant base bias source disposed between the negative terminal of the second dc power source and the ground potential, and a collector connected to that emitter of the third NPN type driver transistor which is connected to the gate of the P channel FET included in said power amplifier circuit, and the fourth PNP type bipolar transistor having an emitter connected via a ninth resistor of substantially the same resistance value as the eighth resistor to the positive terminal of the second dc power source, a base coupled to another constant base bias source disposed between the positive terminal of the second dc power source and the ground potential, and a collector connected to that emitter of the third PNP type driver transistor which is connected to the gate of the N channel FET included in said power amplifier circuit.

6. The bias control circuit claimed in claim 4, wherein the emitter load resistance networks of the third complementary pair of driver transistors comprise an eighth resistor having one end connected to the negative terminal of the second dc power source, and the other end connected to the gate of the P channel FET included in said power amplifier circuit; and a ninth resistor having substantially the same resistance value as the eighth resistor, one end connected to the positive terminal of the second dc power source, and the other end connected to the gate of the N channel FET included in said power amplifier circuit.

7. The bias control circuit claimed in claim 4, wherein the emitter load resistance networks of the third complementary pair of driver transistors comprise a single resistor interconnecting their emitters.

* * * * *